United States Patent [19]
Dill et al.

[11] Patent Number: 4,587,629
[45] Date of Patent: May 6, 1986

[54] RANDOM ADDRESS MEMORY WITH FAST CLEAR

[75] Inventors: Frederick H. Dill, South Salem; Satish Gupta, Croton-on-Hudson, both of N.Y.; Peter J. Warter, Newark, Del.

[73] Assignee: International Business Machines Corporation, Armonk, N.Y.

[21] Appl. No.: 567,301

[22] Filed: Dec. 30, 1983

[51] Int. Cl.[4] .............................................. G06F 12/00
[52] U.S. Cl. .................................... 364/900; 365/218
[58] Field of Search ... 364/200 MS File, 900 MS File; 365/218

[56] References Cited

U.S. PATENT DOCUMENTS 4,314,353  2/1982  Gunter et al. ...................... 364/900
4,513,374  4/1985  Hooks, Jr. ........................... 364/200

Primary Examiner—Raulfe B. Zache
Attorney, Agent, or Firm—Yen S. Yee; George E. Clark; Roy R. Schlemmer

[57] ABSTRACT

A technique and apparatus for augmenting a random access memory with a fast clear or reset mechanism are described. A dynamic RAM having a fast clear mechanism in accordance with the present invention includes means for coupling a digital signal onto all bit lines; and fast reset control means operative for energizing the coupling means for connecting the digital signal to all of the bit lines such that upon energizing of a selected word line, all the bits connected to the selected word line are reset to the state of the digital signal, whereby reset time of the random access memory is reduced. The present invention is especially beneficial for incorporation in a frame buffer of an all points addressable raster scan display, and in a page buffer of an all points addressable printer wherein there is a requirement for high update performance.

9 Claims, 4 Drawing Figures

RANDOM ADDRESS MEMORY WITH FAST CLEAR

TECHNICAL FIELD

The present invention relates generally to a random access memory (RAM) array, and more particularly relates to a buffer memory comprises of RAM arrays having a fast clear or reset feature for display or printer applications.

BACKGROUND ART

In more modern all points addressable (APA) raster display designs, an image to be viewed is stored point by point in a memory subsystem, a frame buffer, comprising dynamic random access memory arrays. This design approach allows independent updating of every pixel so that arbitrarily complex images can be produced. While this design approach allows greater display flexibility, it also gives rise to the requirement of higher display performance because of the larger number of image bits to be displayed.

Within the frame buffer, generally there are two primary processes at work, one for updating the frame buffer to change the image it represents, and another for refreshing the video monitor. Both processes tend to place a challenging requirement on the available bandwidth of the frame buffer. As frame buffer sizes grow because of both decreasing memory costs and increasing image complexity and resolutions in certain applications, the bandwidth requirements also increase proportionally.

Early displays employed magnetic disks and drum for the storage of images because of the prohibitive high cost of semiconductor memory. Later, when semiconductor memory becomes more economical, some display design used large scale integration shift registers. Since both the magnetic and the shift register types of memory are relative slow speed, displays employing these types of memory tend to have relatively low resolution and/or low performance. It was not until more recently that integrated circuit random access memory arrays have become sufficiently low cost enough to be incorporated in APA raster scan displays.

Conventional integrated circuit RAM architectures are heretofore well known. For instance, U.S. Pat. No. 3,387,286 entitled "Field Effect Transistor Memory", issued to R. H. Dennard and assigned to the common assignee of the present application discloses a RAM architecture wherein memory cells are arranged in an array having each memory cell coupled to at least one of a plurality of word lines for the memory and at least one of a plurality of bit lines for the memory. According to the Dennard patent, one memory cell in the array can be accessed at any one cycle for a read or write operation.

Some earlier integrated circuit RAM feature simultaneous erasure. For instance, U.S. Pat. No. 4,172,291, entitled "Preset Circuit For Information Storage Devices", and issued to W. K. Owens, et al, discloses an electronic circuit for simultaneous erasure of all the information stored in an electronic information storage device and enter a predetermined new pattern of information. The patent teaches a bipolar static memory array with an additional transistor current-conducting circuit included on a predetermined side of each memory cell. The additional transistor current conducting circuit in the memory cells along each row are coupled to an an additional word line which is connected to a current switch for the row. An appropriate signal activates the current switch to switch row current temporarily to the additional word line thereby erasing the old data and enter the predetermined pattern of information in the storage device.

Another prior integrated circuit RAM featuring erasure of a number of bits at a time is described in U.S. Pat. No. 4,099,069, entitled "Circuit Producing A Common Clear Signal For Erasing Selected Arrays In A MNOS Memory System" and issued to J. R. Cricchi, et al. According to the patent, memory transistors are arranged in blocks in one of two islands. Erasure of the data stored in a selected block is accomplished by coupling the gates of all the memory transistors to a first voltage and applying a second voltage to the substrate of the memory transistors in the selected block. The first and second voltages are generated by a logic circuit contained substantially in the second island.

Heretofore, some commercial integrated circuit RAM architecture also feature an improved mode of writing a multiple number of memory cells. For instance, as an example of such commercially available RAM, the TMS 4164 64K RAM by Texas Instruments features a page-mode operation for faster access (Texas Instruments July 1980 Catalog, revised May 1982, pp 40–53). With the featured page mode, a multiple number of bits constituting a page can be read/written from or onto the memory array. Page-mode operation allows effectively faster memory access by keeping the same row address and strobing successive column addresses. The access speed improvement of about 30%–50% is possible because the time required to setup and strobe sequential row addresses of the same page is eliminated. Such a page-mode operation is useful for speeding up the reset of APA display frame buffers.

A frequent bottleneck in the design of such APA raster scan displays is the limited available bandwidth of the memory subsystem, more specifically, the frame buffer.

DISCLOSURE OF INVENTION

It is a primary object of the present invention to provide an integrated circuit RAM having a fast clear feature for APA displays.

It is also a principal object of the present invention to provide an improved integrated circuit RAM.

It is another primary object of the present invention to provide an integrated circuit RAM having a fast clear feature for APA printers.

It is generally an object of the present invention to provide an improved APA display.

It is also generally an object of the present invention to provide an improved APA printer.

These and other objects of the present invention can be achieved by way of an integrated circuit random access memory array having a plurality of words, each of said words being arranged in a column of bits connected to a word line, the bits of said words forming rows and having all the bits in each row connected to a bit line, means for addressing each word line and each bit line for writing a selected bit the state of the selected bit line, and a sense amplifier for each bit line for sensing the selected bit, and including the improvement comprising: means for coupling a signal onto all of said bit lines; and fast reset control means operative for energizing said coupling means for connecting said signal to all of said bit lines, and upon energizing of a selected word line, all the bits connected to said selected word line are reset to the state of said signal, whereby reset time of said random access memory is reduced.

Alternatively, other objects of the present invention can be achieved by way of a buffer memory having the foregoing improved random address memory arrays, whereby a word of the buffer memory can be reset at a time, and an existing image stored in said buffer memory can be cleared at a reduced time thereby improving the update speed of said buffer memory.

The nature and principle and utility of the present invention will be better understood from the hereinafter detailed description of the invention when read in conjunction with the accompanying drawings.

BRIEF DESCRIPTION OF THE DRAWINGS

Details of the invention will be described in connection with the accompanying drawings, in which.

BEST MODE FOR CARRYING OUT THE INVENTION

Figure 1:
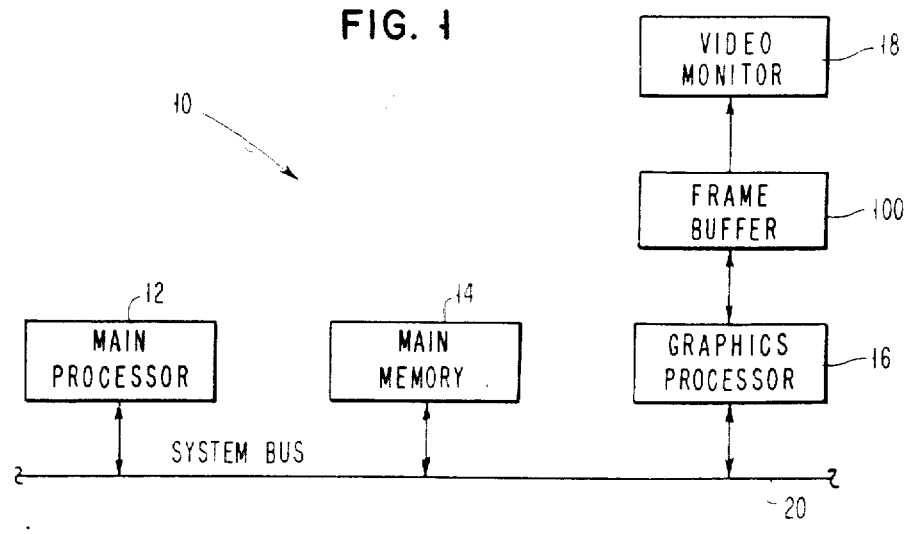
FIG. 1 is a functional block diagram of an all points addressable (APA) graphics display system having a separate frame buffer.

Referring to FIG. 1, an all points addressable (APA) raster scan display system 10 comprises a main processor 12, a main memory 14, a graphics processor 16, which communicate with each other by way of system bus 20. The graphics processor 16 may drive a frame buffer 100 which contains a bit map image of the picture to be displayed on a video monitor 18. According to the present invention, frame buffer 100 features a fast reset enhancement, whereby frame buffer 100 can be reset simultaneously a row at a time to permit fast update of the frame buffer with new image data.

Conventional APA raster scan displays are generally known, detailed descriptions of their operation are in the literature, and are beyond the scope of the present disclosure. Briefly, the APA raster scan display 10 creates images by repeatedly scanning a video monitor 18, a CRT, from left to right and top to bottom of the CRT screen. The intensity of the CRT electron beam is appropriately modified at discrete points (pixels) on the screen, thus presenting the image information as intensity samples at each pixel. The image to be viewed is preferably stored point by point in integrated circuit dynamic metal oxide semiconductor (MOS) FET random address memory (RAM) arrays forming the frame buffer 100.

Two essential processes are performed in association with the frame buffer 100. The frame buffer 100 is periodically updated with new images to be displayed, and secondly, the bit map image contained in the frame buffer 100 is used periodically to refresh the video monitor 18.

For such APA displays 10, the required bandwidth of the refresh process is generally proportional to the number of pixels displayed, and the refresh rate, whereas the bandwidth requirement of the update process depends generally on the response time of a particular application. As frame buffer 100 sizes grow because of both decreasing RAM costs and the need to display ever more complex images in certain applications, the bandwidth requirements of the frame buffer 100 also increase proportionally.

As noted hereinabove, the image on the video monitor 18 has to be continuously refreshed, which requires continual memory access. The rate at which the screen is being refreshed has to be relatively fast so as to avoid flicker. The frame buffer 100 may have a size of, for example, 1024×1024 bits, and can be implemented using, for example, 64 Kilobit RAM chips. With a 1024×1024 bit frame buffer refreshed at 60 times a second, the video monitor 18 must display a pixel every 12 nanoseconds. As a result, the frame buffer 100 must typically access several bits in parallel in order to keep up with the video refresh process. Accordingly, the 1024×1024 bit frame buffer 100 can be implemented, for example, using sixteen 64 Kilobit RAM chips, and one bit from each sixteen chips can be read in parallel in one cycle. However, because of the bandwidth requirement, only the idle time during an horizontal and vertical retrace could be used to update the frame buffer 100. Since rapid picture update is also desired, parallel update of the frame buffer 100 is also necessary.

An approach to achieve rapid picture update is to first clear the entire bit map of the frame buffer 100, and hence presetting it to a known consistent value, for example all "0"s. The frame buffer 100 is then updated by writing only "1"s in the appropriate bit map positions. Since most image has a very substantial number of "0"s, this approach substantially speeds up the updating of the frame buffer 100. In accordance with the present invention, updating of the frame buffer 100 can be further substantially speeded up by clearing the frame buffer 100 a word at a time instead of a bit at a time as practiced heretofore. Details in accordance with the present invention are described hereinafter.

Figure 2:
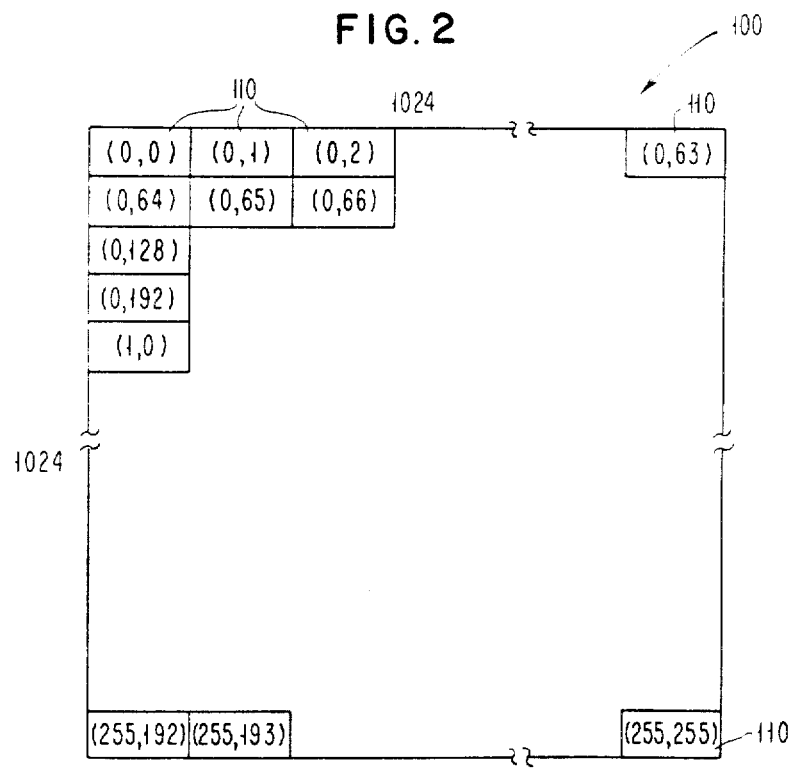
FIG. 2 is a memory mapping of the frame buffer shown in FIG. 1 showing a 1024×1024 frame buffer in a 1×16 mapping utilizing, for example, sixteen 64 kilobit dynamic RAMs.

While frame buffer 100 is shown and described to be a separate buffer in the preferred embodiment, this need not be the only approach. Frame buffer 100 can be integrated as part of the main memory 14. The frame buffer 100 can be organized in a number of ways, for instance, referring to FIG. 2, it can be mapped to all pixels in each word 110 along a scan line on the video monitor 18. Each word 110 contains sixteen bits, and all the bits in each 1×16 box 110 can be accessed by providing the sixteen memory chips with the associated row and column addresses, such as (0,0), (0,64), (0,65) etc., which row and column addresses are shown in FIG. 2 in decimals.

As indicated hereinabove, each of the sixteen memory chips is preferably a dynamic RAM array. Conventional dynamic RAM organizations are known to one of ordinary skill in the art. Generally, such RAM arrays may have a plurality of digital words, each of the words being arranged in a row of bits, and having bits of the words forming columns, means for addressing the words and each row of words, and a sense amplifier for each row of bits, Briefly, and more specifically by referring to FIG. 3, each 64 Kilobit RAM array 120, can be conceptually thought of as an organization having 256 words of 256 bits each. The addresses of such a RAM 120 are typically provided on eight multiplexed address lines (address lines not shown). The column address determines, by way of word line drivers 122, which word line 124 is to be selected, and the row address selects, by way of bit line drivers and sense amplifiers 126, which bit in the selected memory cell 125 amongst the bits of the selected word on word line 124 is to be gated as output data.

Figure 3:
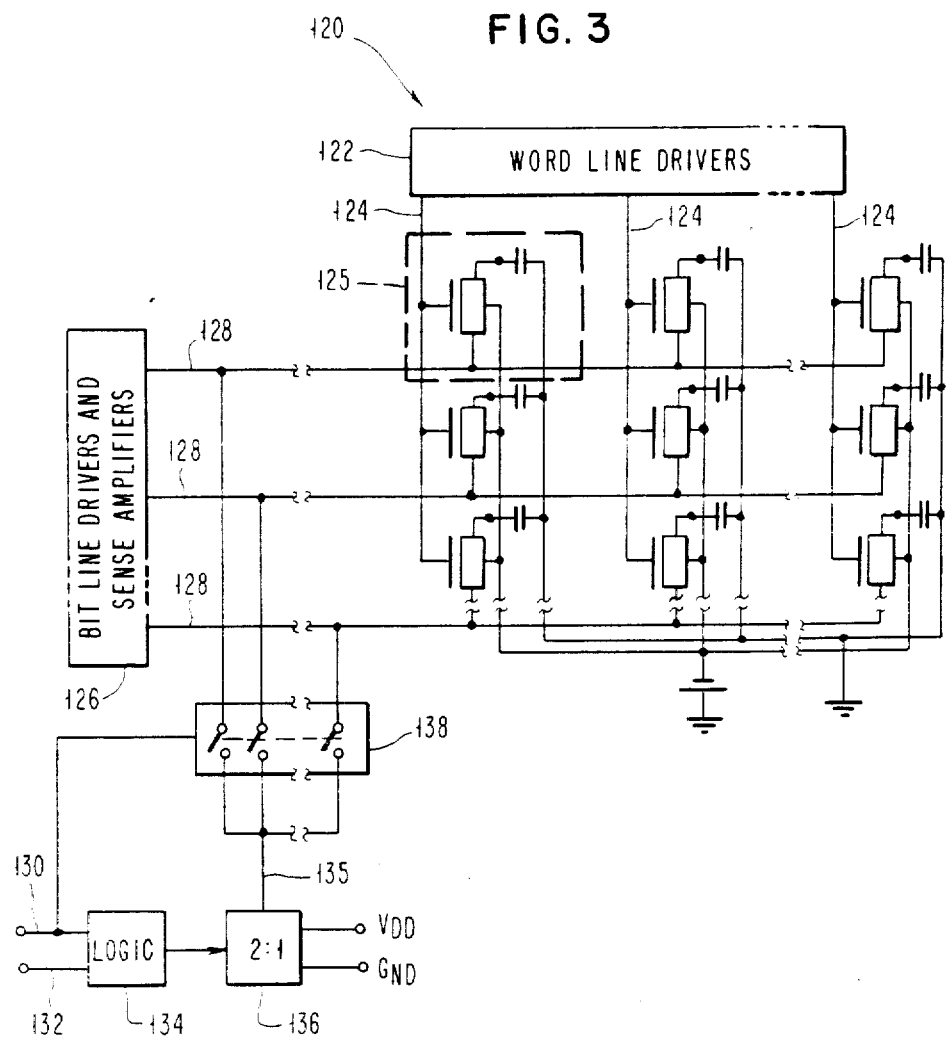
FIG. 3 is a preferred embodiment of the dynamic random access memory array having a fast clear feature in accordance with the present invention for reducing the updating time of the frame buffer.

Referring to FIG. 3, dynamic RAM 120 according the present invention includes a FAST CLEAR 130 and DATA-IN 132 inputs connected to logic means 134 which feeds a 2:1 multiplexer 136. Two voltage sources Vdd and GND correspond to logical "1" and "0", respectively, are provided to multiplexer 136 for selective connection to bit lines 128, by way of switch bank 138, which is in turn under the control of FAST CLEAR input 130. In a normal memory access operation to refresh video monitor 18, FAST CLEAR input 130 is low, and all the contacts in switch bank 138 are open. With the bit lines 128 isolated from the output 135 of the multiplexer 136, RAM 120 operates in its usual conventional manner. In a fast clear operation to enable fast update of the frame buffer 100, the FAST CLEAR input 130 is high to close the contacts in switch bank 138, and thereby connecting all the bit lines 128 to the output 135 of multiplexer 136. The output of multiplexer 136 is either at Vdd or GND depending on DATA IN being a "1" or "0", respectively. Stated in another way, if the frame buffer 100 were to be reset to "0", DATA IN needs be a "0". When FAST CLEAR input 130 becomes high, it connects the GND potential (logical "0") provided by the output 135 of multiplexer 136 to all the bit lines 128 by way of switch bank 138. When a particular word line 128 is selected by raising the selected word line 124 high, each memory cell 125 associated with the selected word line 124 is written with the "0" present in all the bit lines 128. Furthermore, by sequentially raising each of the 256 word lines 124, all the memory cells 125 associated with each word line 124, and therefore all the memory cells 125 in the entire frame buffer 100 are reset to the state designated at the DATA IN input 132. Thus, in accordance with the present invention, only 256 memory cycles would be required to clear the frame buffer 100, whereas with the conventional RAM frame buffer 100, 64,000 memory cycles would be required to clear or reset all of the sixteen 64 Kilobit RAMs in the frame buffer 100. Therefore, frame buffers 100 incorporating the present dynamic memory 120 with fast reset allows column-by-column clear in accordance with the teaching of the present invention having substantially reduce reset time, and therefore substantially improved update speeds.

It should be noted that while the output 135 of multiplexer 136 is described to be a digital signal having either a logical 1 or 0 value, output 135 can be an analog signal generally. In which case, all the bits in a selected word line 124 will be reset to a value of the analog signal at the time of fast reset.

Figure 4:
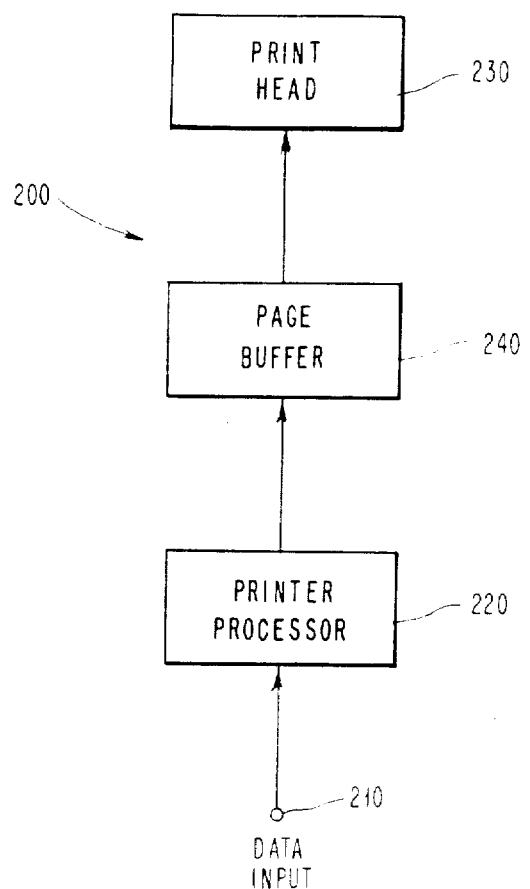
FIG. 4 is a functional diagram of an all points addressable (APA) printer which also incorporates the preferred dynamic RAM shown in FIG. 3.

Although the dynamic RAM 100 with fast reset in FIG. 3 is shown and described in connection with an APA display 10, other embodiments, variations and modifications of the present invention are also possible. Referring to FIG. 4, an all points addressable (APA) printer 200 having a Data Input 210, a print processor 220, a print head 230, and a page buffer 240, may also incorporates the present invention by including the dynamic RAM 120 with fast reset in the page buffer 240 design. As is in APA display 10 applications, the page buffer 240 in the APA printer 200 also demands fast update speed. When a page image needs to be changed for a new page, the existing page is similarly first cleared, and then the new page image is written onto the page buffer 240 by writing only "1"s in appropriate selected memory cells 125 of dynamic RAM 100 with fast reset. Page buffer 240 incorporating the present dynamic memory 120 with fast reset allows column-by-column clear, thereby substantially improve update speed of the page buffer 240.

While the dynamic RAM 120 with a fast reset as shown in FIG. 3 is particularly described for the frame, page buffers 100, 240 in APA display 10 and printer 200 shown in FIGS. 1 and 4, clearing memory, i.e., presetting it to a known consistent value, is a very common operation generally in computer systems. The need for this stems from the fact that when large areas of memory are designated to be used for a task that does not necessarily require writing into all of the designated areas, it is desirable to have the area that is not going to be written into in a known reset state. Accordingly, the present dynamic RAM 120 with fast reset has general applicability in many computer memory system applications.

Although the present invention is shown and described in connection with a dynamic RAM, it is clear that this is only an exemplary embodiment. Other embodiments are also applicable, for instance, the fast clear feature in accordance with the present invention could be incorporated in a static RAM. Furthermore, while MOSFET RAM is shown and described in connection with the preferred embodiment, other switching devices such as bipolar transistors could also be employed, or substituted instead.

As noted above, the present invention could have applicability beyond that of a buffer memory for displays and printers as described hereinabove. Some other specific applications which would also benefit from the present invention include memory caches directories, and transition look-aside buffers.

From the preceding detailed description of Applicants' invention, it has been seen that memory systems generally, frame buffers 100 for APA displays 10, and page buffers 240 for APA printers 200 in particular, incorporating such dynamic RAMs 120 with fast reset have advantages heretofore not possible to achieve. In addition to the variations and modifications of Applicants' disclosed apparatus, which have been suggested, many variations and modifications will be apparent to those skilled in the art, and accordingly, the scope of Applicants' invention is not to be construed to be limited to the particular embodiments shown or suggested.

We claim:

1. In an integrated circuit random access memory array having a plurality of words of storage capacity, each of said words being arranged in a column of bits connected to a word line, the bits of said words forming rows and having all the bits in each row connected to a bit line, means for addressing each word line and each bit line for writing in a selected bit to establish the state of the selected bit line, and a sense amplifier for each bit line for sensing the selected bit, the improvement comprising:

means for coupling a signal onto said bit lines; and
   fast reset control means connected to said coupling means for connecting said signal to said bit lines, and upon energizing of a selected word line, all the bits connected to said selected word line are reset to the state of said signal, whereby reset time of said random access memory is reduced.

2. In an integrated circuit random address memory array as set forth in claim 1, wherein said signal is digital having either a logical 1 or 0 state.

3. In an integrated circuit random address memory array as set forth in claim 2, wherein said random address memory array is a dynamic RAM.

4. A display having a memory subsystem comprising a plurality of improved integrated circuit random access memory arrays, each characterized by having a plurality of words of storage capacity, each of said words being arranged in a column of bits connected to a word line, the bits of said words forming rows and having all the bits in each row connected to a bit line, means for addressing each word line and each bit line for writing in a selected bit to establish the state of the selected bit line, and a sense amplifier for each bit line for sensing the selected bit, the improvement comprising:

means for coupling a signal onto said bit lines; and
fast reset control means connected to said coupling means for connecting said signal to said bit lines, and upon energizing of a selected word line, all the bits connected to said selected word line are reset to the state of said signal, whereby reset time of said random access memory is reduced.

5. A display as set forth in claim 4, wherein said memory subsystem is a frame buffer, and wherein said display is an all points addressable raster scan display.

6. A display as set forth in claim 5, wherein said random address memory array is a dynamic RAM.

7. A printer having a memory subsystem comprising a plurality of improved integrated circuit random access memory arrays, each characterized by having a plurality of words of storage capacity, each of said words being arranged in a column of bits connected to a word line, the bits of said words forming rows and having all the bits in each row connected to a bit line, means for addressing each word line and each bit line for writing in a selected bit to establish the state of the selected bit line, and a sense amplifier for each bit line for sensing the selected bit, the improvement comprising:

means for coupling a signal onto said bit lines; and
fast reset control means connected to said coupling means for connecting said signal to said bit lines, and upon energizing of a selected word line, all the bits connected to said selected word line are reset to the state of said signal, whereby reset time of said random access memory is reduced.

8. A printer as set forth in claim 7, wherein said memory subsystem is a page buffer, and wherein said printer is an all points addressable printer.

9. A printer as set forth in claim 8, wherein said random address memory array is a dynamic RAM.

* * * * *